(12) United States Patent
Zhang

(10) Patent No.: US 10,535,291 B2
(45) Date of Patent: Jan. 14, 2020

(54) DISPLAY DEVICE AND CONTROL METHOD THEREOF, AND DISPLAY SYSTEM

(71) Applicants: BOE TECHNOLOGY GROUP CO., LTD., Beijing (CN); BEIJING BOE DISPLAY TECHNOLOGY CO., LTD., Beijing (CN)

(72) Inventor: Chunbing Zhang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/257,075

(22) Filed: Sep. 6, 2016

(65) Prior Publication Data

US 2017/0278443 A1     Sep. 28, 2017

(30) Foreign Application Priority Data

Mar. 25, 2016   (CN) .......................... 2016 1 0178727

(51) Int. Cl.
*G09G 3/20*       (2006.01)
*H01L 27/32*      (2006.01)
(Continued)

(52) U.S. Cl.
CPC ......... *G09G 3/2003* (2013.01); *G09G 3/3208* (2013.01); *H01L 27/3211* (2013.01);
(Continued)

(58) Field of Classification Search
CPC .. G09G 3/2003; G09G 3/3208; G09G 3/2074; H01L 27/3211; H01L 51/5012
See application file for complete search history.

(56) References Cited

U.S. PATENT DOCUMENTS 5,614,924 A * 3/1997 Numao ................ G09G 3/3607
345/89
9,632,344 B2 * 4/2017 Ludwig ............... G02F 1/13338
(Continued)

FOREIGN PATENT DOCUMENTS

| CN | 102110402 A | 6/2011 |
| CN | 102857773 A | 1/2013 |
| CN | 104122705 A | 10/2014 |

OTHER PUBLICATIONS

The First Chinese Office Action dated Aug. 2, 2017; Appln. No. 201610178727.8.

*Primary Examiner* — Sejoon Ahn

(57) ABSTRACT

Embodiments of the present disclosure provide a display device and a control method thereof, and a display system. The display device includes a substrate and a pair of sub-pixels disposed on the substrate. The pair of sub-pixels includes a display sub-pixel and an interference sub-pixel, wherein the display sub-pixel and the interference sub-pixel are different in at least one of color or gray scale, wherein the display device has a light outgoing direction intersecting with the substrate; in the light outgoing direction, a projection of the display sub-pixel on a main surface of the substrate at least partially overlaps with a projection of the interference sub-pixel on the main surface of the substrate; and the display sub-pixel and the interference sub-pixel are configured to be capable of respectively emitting light in non-overlapping time periods.

14 Claims, 4 Drawing Sheets

(51) Int. Cl.
  *H01L 51/50* (2006.01)
  *H01L 51/52* (2006.01)
  *H05K 5/00* (2006.01)
  *G09G 3/3208* (2016.01)

(52) U.S. Cl.
  CPC ...... *H01L 51/5012* (2013.01); *H01L 51/5218* (2013.01); *H01L 51/5234* (2013.01); *H01L 51/5275* (2013.01); *H05K 5/0017* (2013.01); *H05K 5/0086* (2013.01); *G09G 3/2074* (2013.01); *G09G 2320/068* (2013.01); *G09G 2320/0646* (2013.01); *G09G 2320/0666* (2013.01); *G09G 2358/00* (2013.01); *H01L 2251/5315* (2013.01)

(56) References Cited

U.S. PATENT DOCUMENTS

| | | | | |
|---|---|---|---|---|
| 2002/0063701 A1* | 5/2002 | Sano | | G09G 3/2003 345/204 |
| 2002/0140364 A1* | 10/2002 | Inukai | | G09G 3/2074 315/169.3 |
| 2005/0007518 A1* | 1/2005 | Kato | | G02F 1/133603 349/69 |
| 2007/0013633 A1* | 1/2007 | Kamada | | G02F 1/1362 345/98 |
| 2007/0152932 A1* | 7/2007 | Chung | | G09G 3/3648 345/88 |
| 2007/0182682 A1* | 8/2007 | Hong | | G09G 3/3413 345/88 |
| 2011/0037791 A1* | 2/2011 | Haas | | G09G 3/2003 345/690 |
| 2011/0187964 A1 | 8/2011 | Li et al. | | |
| 2011/0241983 A1* | 10/2011 | Chang | | G09G 3/3648 345/156 |
| 2011/0267381 A1* | 11/2011 | Yamazaki | | G09G 3/3413 345/690 |
| 2012/0013635 A1* | 1/2012 | Beeman | | G09G 3/2003 345/590 |
| 2012/0098849 A1* | 4/2012 | Choi | | G09G 3/20 345/589 |
| 2013/0002652 A1 | 1/2013 | Woo | | |
| 2013/0063499 A1* | 3/2013 | Tanaka | | G09G 3/3648 345/690 |
| 2015/0042691 A1* | 2/2015 | Gong | | G09G 3/3413 345/690 |
| 2015/0125086 A1* | 5/2015 | Jeong | | H04N 19/136 382/239 |
| 2015/0303241 A1* | 10/2015 | Zhang | | H01L 27/3213 257/40 |
| 2016/0005380 A1* | 1/2016 | Lim | | G09G 3/3614 345/690 |
| 2016/0011450 A1 | 1/2016 | Li et al. | | |
| 2016/0049112 A1* | 2/2016 | Jung | | G09G 3/3225 345/694 |
| 2016/0056199 A1* | 2/2016 | Kim | | H01L 27/14643 250/208.1 |
| 2016/0299354 A1* | 10/2016 | Shtukater | | G02C 7/04 |
| 2017/0052643 A1* | 2/2017 | Iwami | | G09F 9/00 |

* cited by examiner

DISPLAY DEVICE AND CONTROL METHOD THEREOF, AND DISPLAY SYSTEM

TECHNICAL FIELD

Embodiments of the present disclosure relate to a display device and a control method thereof, and a display system.

BACKGROUND

Currently, users pay more and more attention to anti-peeping of displayed information. A traditional method for anti-peeping of displayed information achieves confidential display of information mainly by reducing a viewing angle of a display device, such that only a person located right in front of the display device can see content on the display device, and persons in other positions cannot see the content on the display device.

SUMMARY

An embodiment of the present disclosure provides a display device includes a substrate and a pair of sub-pixels disposed on the substrate. The pair of sub-pixels includes a display sub-pixel and an interference sub-pixel, wherein the display sub-pixel and the interference sub-pixel are different in at least one of color or gray scale, wherein the display device has a light outgoing direction intersecting with the substrate; in the light outgoing direction, a projection of the display sub-pixel on a main surface of the substrate at least partially overlaps with a projection of the interference sub-pixel on the main surface of the substrate; and the display sub-pixel and the interference sub-pixel are configured to be capable of respectively emitting light in non-overlapping time periods.

Another embodiment of the present disclosure provides a display system, including a wearable device and the above described display device, wherein, the wearable device includes a lens, and the lens is configured to be in a non-transmissive state, in a case that the interference sub-pixel emits light.

Yet another embodiment of the present disclosure provides a control method of a display device, wherein, the display device comprises a substrate and a pair of sub-pixels disposed on the substrate, the pair of sub-pixels includes a display sub-pixel and an interference sub-pixel, the display sub-pixel and the interference sub-pixel are different in at least one of color or gray scale, wherein the display device has a light outgoing direction intersecting with the substrate; in the light outgoing direction, a projection of the display sub-pixel on a main surface of the substrate at least partially overlaps with a projection of the interference sub-pixel on the main surface of the substrate, the method includes: controlling the display sub-pixel to be turned on in a first time period of a display cycle; controlling the interference sub-pixel to be turned on in a second time period of the display cycle which does not overlap with the first time period.

BRIEF DESCRIPTION OF THE DRAWINGS

In order to clearly illustrate the technical solution of the embodiments of the disclosure, the drawings needing to be used in the embodiments or relevant technical description will be briefly described in the following; it is obvious that the described drawings are only related to some embodiments of the disclosure and thus are not limitative of the disclosure.

DETAILED DESCRIPTION

The traditional confidentiality manner has some disadvantages; if a peeper and an observer are both located in front of the display device, the peeper can also see the content on a display, and therefore a confidentiality effect of the anti-peeping manner is not ideal.

The technical solutions of the embodiments of the present disclosure will be described in a clearly and fully understandable way in connection with the drawings. It is obvious that the described embodiments are just a part but not all of the embodiments of the present disclosure. Based on the embodiments in the present disclosure, those skilled in the art can obtain other embodiment(s), without any inventive work, which should be within the scope of the present disclosure. What needs to be explained is that, in a case of no conflict, the embodiments of the disclosure and characteristics in the embodiments can be combined.

In the following description, many specific details are elaborated so as to fully understand the embodiments of the present disclosure, but, the embodiments of the present disclosure can be implemented in other ways different from description herein, and therefore the scope of the present disclosure is not limited by the specific embodiments of the present disclosure.

A display device and a control method thereof, and a display system provided by the embodiments of the present disclosure can improve an anti-peeping effect.

Figure 1:
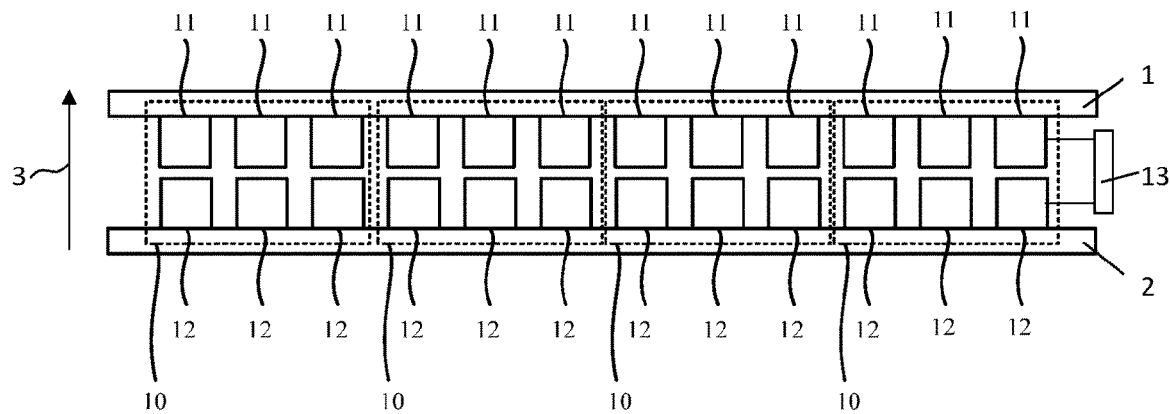
FIG. 1 is a structural schematic diagram of a display device according to an embodiment of the present disclosure.
Figure 2:
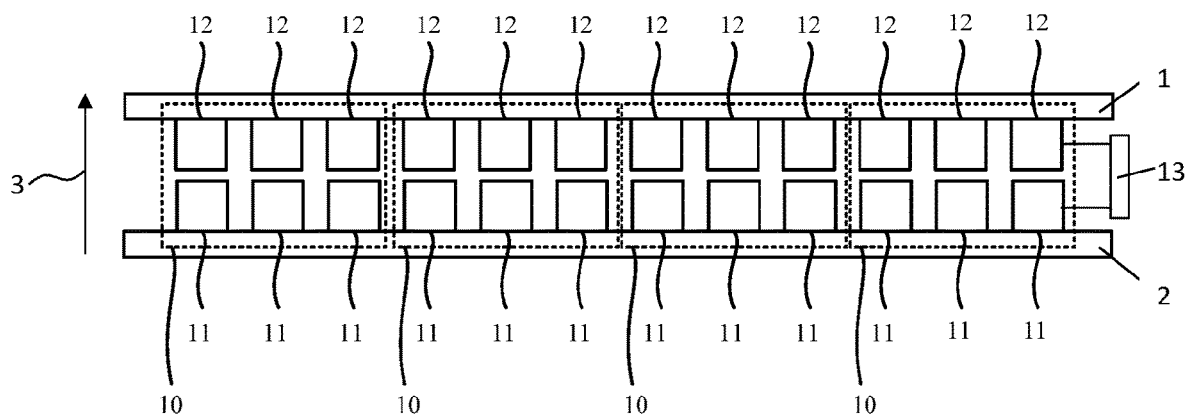
FIG. 2 is a structural schematic diagram of a display device according to another embodiment of the present disclosure.

As shown in FIG. 1 and FIG. 2, a display device according to an embodiment of the present disclosure, includes: a plurality of pixel units 10, arranged on a side of a first substrate 1, each pixel unit 10 includes a plurality of display sub-pixels 11 and a plurality of interference sub-pixels 12; the interference sub-pixels 12 are arranged on a side of the display sub-pixels 11 away from or close to the first substrate 1 in one-to-one correspondence. For example, the display device further includes a second substrate 2 opposite to the first substrate 1. The a plurality of interference sub-pixels 12 are disposed on the second substrate 2. In one pixel unit 10, a color and/or a gray scale of the interference sub-pixel 12 corresponding to at least one display sub-pixel 11 are/is different from a color and/or a gray scale of such display sub-pixel 11; the display device has a light outgoing direction 3 intersecting with the first substrate 1. For example, in the embodiments shown in FIG. 1 and FIG. 2, an upward direction indicated by an arrow and perpendicular to the first substrate 1 is the light outgoing direction 3 of the display device. In the light outgoing direction 3, projections of the display sub-pixels on a main surface (such as a lower surface) of the first substrate 1 at least partially overlap with those of the interference sub-pixels on the main surface of the first substrate. Display sub-pixels 11 and interference sub-pixels 12 corresponding to each other are configured to be capable of emitting light in different time periods. For example, the display device can also comprise a first control unit 13 controlling the display sub-pixels 11 to be turned on in a first time period of a display cycle and controlling the interference sub-pixels 12 to be turned on in a second time period of the display cycle. The first time period and the second time period do not overlap with each other.

Figure 3:
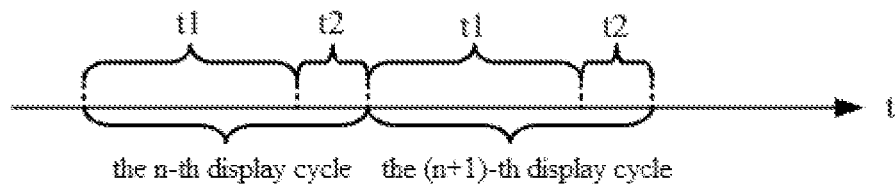
FIG. 3 is a schematic diagram of turning-on time of a display sub-pixel and an interference sub-pixel according to an embodiment of the present disclosure.

According to the embodiment, when the display device outputs an image, a display image and an interference image are alternately output according to a sequence that the display sub-pixels are turned on to output a normal display image and the interference sub-pixels are turned on to output the interference image. For example, as shown in FIG. 3, for a pair of the corresponding display sub-pixel 11 and interference sub-pixel 12, the display sub-pixel 11 is turned on to output the normal display image in a first time period t1 of an n-th frame, then the display sub-pixel 11 is turned off and the interference sub-pixel 12 is turned on to output the interference image in a second time period t2 of the n-th frame, then the interference sub-pixel 12 is turned off and the display sub-pixel is turned on again to output the normal display image in the first time period t1 of an (n+1)-th frame, and then the display sub-pixel 11 is turned off and the interference sub-pixel is turned on again to output the interference image in the second time period t2 of the (n+1)-th frame, and so on, where, n is a positive integer greater than or equal to 1.

It should be noted that, the first time period can be prior to the second time period in each display cycle; the interference sub-pixels are turned off in the first time period, and the display sub-pixels are turned off in the second time period. Of course, it can also the second time period can also be arranged prior to the first time period. One display cycle in the above embodiment can refer to a sum of duration of scanning all the display sub-pixels in the display device for one time and duration of scanning all the interference sub-pixels in the display device for one time.

Because in one pixel unit, the color and/or the gray scale of the interference sub-pixel corresponding to at least one display sub-pixel are/is different from the color and/or the gray scale of the at least one display sub-pixel, the pixel unit can emit different lights in different time periods (for example, the first time period t1 and the second time period t2), and therefore a viewer can see different images in the second time period and the first time period. Because human eyes have vision persistence on a changing picture, the interference image and the normal display image can be superposed and the normal display image cannot be seen clearly. Then, a user can only receive a picture of the first time period through a specific viewing device, and therefore it can effectively prevent a normal picture output by the display device from being recognized by other persons.

Figure 4:
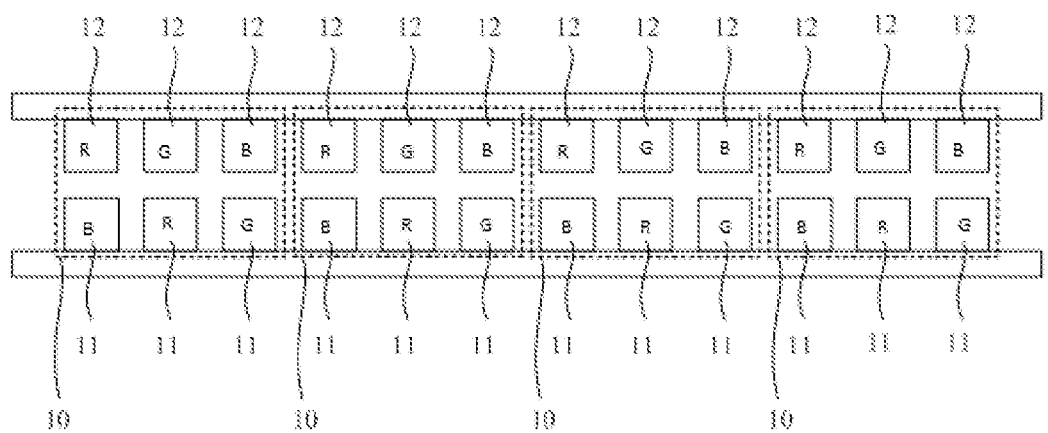
FIG. 4 is a structural schematic diagram of a display device according to still another embodiment of the present disclosure.

In one example, in a case that a display sub-pixel includes a red display sub-pixel, a green display sub-pixel and a blue display sub-pixel, as shown in FIG. 4, the interference sub-pixel 12 corresponding to the red display sub-pixel emits green light, the interference sub-pixel 12 corresponding to the green display sub-pixel emits blue light, and the interference sub-pixel 12 corresponding to the blue display sub-pixel emits red light. It can be understood that, which is only exemplified herein, the arrangement of the interference sub-pixels and the display pixels is not limited thereto, as long as an interference purpose is met. For example, in one pixel unit, only the interference sub-pixel corresponding to the red sub-pixel is set to emit blue light, while the interference sub-pixel corresponding to the blue sub-pixel still emits blue light, and the interference sub-pixel corresponding to the green sub-pixel still emits green light. In this way, it can also be that light emitted by the pixel in the second time period is different from light emitted by the pixel at the first time period, thus achieving interference.

For example, a light outgoing area of each interference sub-pixel is same as that of each display sub-pixel, and output brightness of the interference sub-pixel is same as that of the display sub-pixel so that a good interference effect can be achieved.

For example, a connection line of a center of each interference sub-pixel and a center of a corresponding display sub-pixel is perpendicular to a plane where the first substrate is located, and for example, the connection line is perpendicular to a main surface of the first substrate.

According to the embodiment, an area occupied by the interference sub-pixels and the display sub-pixels can be small (the area occupied by the interference sub-pixels and the display sub-pixels is minimum in a case that a light outgoing area of the interference sub-pixels and a light outgoing area of the display sub-pixels are the same), which thus improves a number of the pixel units in unit area, and therefore a display effect is improved.

For example, the first time period is greater than or equal to the second time period.

According to the embodiment, display duration of the normal display image in each cycle (frame) is greater than or equal to that of the interference image, so that the user wearing the specific viewing device can well view the normal image, and there is no strong intermittent feeling.

For example, a ratio of the first time period to the second time period is k, and k is greater than or equal to 1 and less than or equal to 5.

According to the embodiment, it can be guaranteed that the display duration of the normal display image in each cycle (frame) is greater than or equal to that of the interference image, so that the user wearing the specific viewing device can well view the normal image, and there is no strong intermittent feeling. It can also be guaranteed that the interference image has a strong enough interference effect on the normal display image, and it is guaranteed that a peeper without wearing the specific viewing device cannot see clearly the normal display image.

For example, if the gray scale of the display sub-pixel and the gray scale of the interference sub-pixel are the same, the color of the display sub-pixel and the color of the interference sub-pixel can be complementary colors.

For example, the display sub-pixel is a red sub-pixel, and the interference sub-pixel is a cyan sub-pixel; and/or the display sub-pixel is a green sub-pixel, and the interference sub-pixel is a magenta sub-pixel; and/or the display sub-pixel is a blue sub-pixel, and the interference sub-pixel is a green sub-pixel.

Two complementary colors are superposed into a white color. Therefore, according to the embodiment, when the peeper without wearing the specific viewing device views the display sub-pixels and the interference sub-pixels, only a white picture is seen because of vision persistence, thus effectively preventing the normal display picture from being recognized by other persons.

Figure 5:
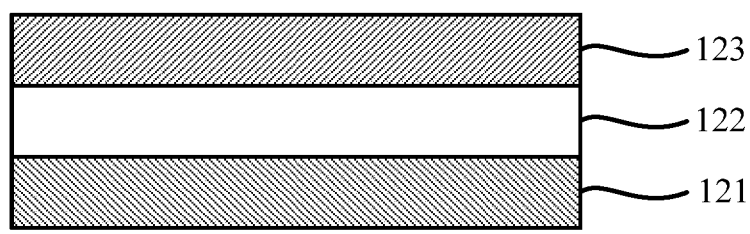
FIG. 5 is a structural schematic diagram of a display sub-pixel according to an embodiment of the present disclosure.
Figure 6:
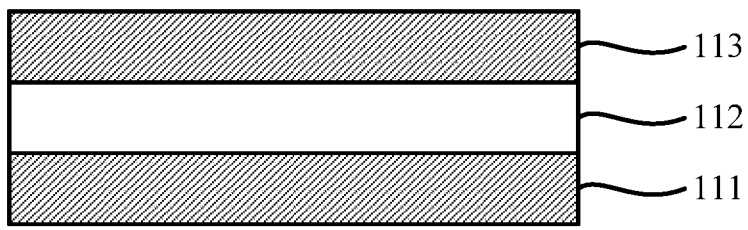
FIG. 6 is a structural schematic diagram of an interference sub-panel according to an embodiment of the present disclosure.

In one optional embodiment of the present disclosure, the interference sub-pixels and the display sub-pixels are sequentially arranged along the light outgoing direction of the display device, as shown in FIG. 5, the interference sub-pixel 12 includes: a first electrode layer 121, a first light-emitting layer 122 and a second electrode layer 123 which are sequentially arranged along the light outgoing direction of the display device. A material of the first electrode layer 121 is light reflecting metal; and a material of the second electrode layer 123 is a transparent material;

As shown in FIG. 6, the display sub-pixel 11 includes: a third electrode layer 111, a second light-emitting layer 112 and a fourth electrode layer 113 which are sequentially arranged along the light outgoing direction of the display device. A material of the third electrode layer 111 and a material of the fourth electrode layer 113 are both of transparent material.

The display device in the embodiment can be an organic light-emitting diode display device. It should be noted that, the display sub-pixels in the embodiment are transparent when being in a turning-off state.

For example, the light-emitting layer is used for emitting red light, green light, blue light, cyan light, magenta light and/or yellow light.

Figure 7:
FIG. 7 is a structural schematic diagram of a display sub-pixel according to another embodiment of the present disclosure.

In another optional embodiment of the present disclosure, the display sub-pixels and the interference sub-pixels are sequentially arranged along the light outgoing direction of the display device, as shown in FIG. 7, the display sub-pixel 11 includes: a fifth electrode layer 111', a third light-emitting layer 112' and a sixth electrode layer 113' which are sequentially arranged along the light outgoing direction of the display device. A material of the fifth electrode layer 111' is light reflecting metal; and a material of the sixth electrode layer 113' is a transparent material.

Figure 8:
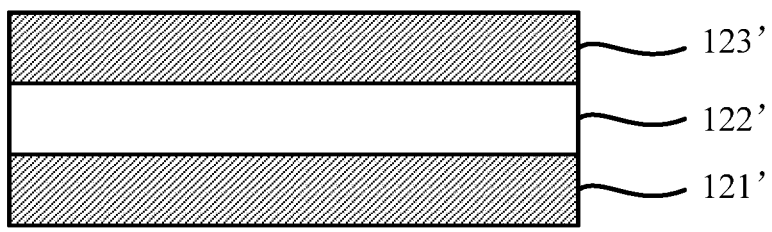
FIG. 8 is a structural schematic diagram of an interference sub-panel according to another embodiment of the present disclosure.

As shown in FIG. 8, the interference sub-pixel 12 includes: a seventh electrode layer 121', a fourth light-emitting layer 122' and an eighth electrode layer 123'. A material of the seventh electrode layer 121' and a material of the eighth electrode layer 123' are both of transparent material.

It should be noted that, the interference sub-pixels in the embodiment are transparent when being in a turning-off state.

A display device in the embodiment can be an organic light-emitting diode display device.

For example, the light emitting layer is used for emitting red light, green light, blue light, cyan light, magenta light and/or yellow light.

For example, the interference sub-pixels are sub-pixels which are not white nor black.

If the interference sub-pixels are sub-pixels in white or black, the user can still distinguish the normal display picture by the display sub-pixels when viewing the picture with naked eyes, because white or black sub-pixels can only perform a function of changing brightness of the corresponding display sub-pixels. According to the embodiment, the interference sub-pixels are sub-pixels which are not white nor black, and an interference effect of the interference sub-pixels on the display sub-pixels can be guaranteed.

In one optional embodiment of the present disclosure, the first control unit is further configured for controlling the display sub-pixels to be turned on in all time periods of one display cycle and controlling the interference sub-pixels to be turned off in all time periods of the display cycle.

According to the embodiment, the display sub-pixels can be control to be turned on in all time periods of one display cycle under a normal display mode so as to guarantee that the normal picture has enough display duration, and a viewing effect of the user is guaranteed.

Optionally, if the color of the interference sub-pixels and the color of the display sub-pixels are same, a gray scale difference between the interference sub-pixels and the display sub-pixels can be greater than or equal to 50.

According to the embodiment, only the gray scale of the display sub-pixels and the gray scale of the interference sub-pixels are set to be different, and therefore light-emitting brightness of the display sub-pixels and the interference sub-pixels can be controlled through a circuit, and materials of the light-emitting layers can be same, which is easy to simplify a structure.

The present disclosure further provides a display device, comprising the above display device.

What needs to be explained is that, the display device in the embodiment can be a display panel, an electronic paper, a mobile phone, a tablet personal computer, a TV set, a laptop, a digital photo frame, a navigator or any product or part with a display function.

Figure 9:
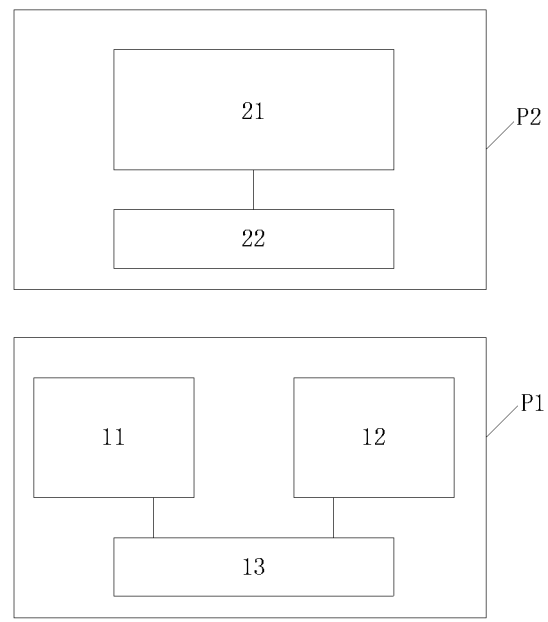
FIG. 9 is a schematic diagram of a display system provided according to an embodiment of the present disclosure.

The present disclosure further provides a display system, referring to FIG. 9, comprising the above display device P1 and a wearable device P2, The wearable device P2 includes a lens 21 and a second control unit 22. The second control unit 22 is configured to be capable of controlling the lens to be transmissive in the above described first time period t1 and non-transmissive in the above described time period t2.

According to the embodiment, the user can wear the wearable device to view the display device, and therefore the normal display images output by the display sub-pixels can be viewed only in the first time period, a user without wearing the wearable device can see a superposed image of the normal display image and the interference image, and therefore content in the normal display image cannot be distinguished, and an anti-peeping effect is achieved.

For example, the second control unit 22 is further configured to be capable of controlling the lens 21 to be transmissive in all time periods of one display cycle.

Herein, the first control unit 13 and the second control unit 22 in the embodiments of the present disclosure, for example, can include a printed circuit board and the like. For example, the first control unit 13 is electrically connected with the corresponding display sub-pixels 11 and the corresponding interference sub-pixels 12, and the second control unit 22 is, for example, electrically connected with the lens 21.

An embodiment of the present disclosure further provides a control method of a display device. The display device comprises a plurality of pixel units, arranged a one side of a first substrate, each pixel unit includes a plurality of display sub-pixels and a plurality of interference sub-pixels, and each interference sub-pixel is correspondingly arranged on a side of each display sub-pixel away from or close to the first substrate one to one, wherein, in one pixel unit, a color and/or a gray scale of the interference sub-pixel corresponding to at least one display sub-pixel are/is different from a color and/or a gray scale of the at least one display sub-pixel. The method includes: controlling the display sub-pixels to be turned on in the first time period of one display cycle; and controlling the interference sub-pixels to be turned off in the second time period of the display cycle.

For example, the method further includes: controlling the display sub-pixels to be turned on in all time periods of one display cycle; controlling the interference sub-pixels to be turned off in all time periods of the display cycle.

The technical solutions of the present disclosure are explained in detail in connection with the drawings. It is difficult to completely avoid that a peeper views an image output from a display device by using a traditional anti-peeping technology. By means of the technical solutions of the embodiments of the present disclosure, when the display device outputs an image, the image is repeatedly output according to a sequence that the display sub-pixels are turned on to output a normal image and the interference sub-pixels are turned off to output an interference image. Because in one pixel unit, a color and/or a gray scale of the interference sub-pixel corresponding to at least one display sub-pixel are/is different from a color and/or a gray scale of the at least one display sub-pixel, a viewer can see in the second time period an image different from that of the first time period. Because human eyes have vision persistence on a changing picture, the interference image and the normal display image can be superposed and the normal display image cannot be seen clearly. Then, a user can only receive the picture of the first time period through a specific viewing device, and therefore it can effectively prevent a picture output by the display device from being recognized by other persons.

What needs to be pointed out is that, in the drawings, a size of a layer and a size of a region may be overstated in order to make graphical representation clear. It can be understood that, when an element or a layer is referred to as "on" another element or layer, the element or the layer can be directly arranged on other elements, or a middle layer can present. Besides, it can be understood that, when an element or a layer is referred to as "below" another element or layer, the element or the layer can be directly arranged below other elements, or one or more middle layers or elements can present. In addition, it can also be understood that, when a layer or an element is referred to as "between" two layers or two elements, the layer or the element can be a unique layer between the two layers or the two elements, or one or more middle layers or elements can present Similar reference signs indicate similar elements throughout the whole description.

In the embodiments of the present disclosure, terms from "first" to "eighth" are only used for a purpose of description and not intended to indicate or imply relative importance. A term "a plurality of" refers to two or more, unless otherwise specified.

Although the embodiment of the disclosure has been described above in great detail with general descriptions and specific embodiments, on the basis of the embodiment of the disclosure, various changes and improvements may be made, which is apparent to those skilled in the art. Therefore, all such changes and improvements without departing from the spirit of the disclosure are within the scope of the claims of the disclosure.

The present application claims priority of Chinese Patent Application No. 201610178727.8 filed on Mar. 25, 2016, the present disclosure of which is incorporated herein by reference in its entirety as part of the present application.

The invention claimed is:

1. A display device, comprising:
a substrate,
a plurality of sub-pixel pairs, each of the sub-pixel pairs consisting of a display sub-pixel and an interference sub-pixel which are disposed at a same side of the substrate and overlapped with each other in a light outgoing direction intersecting with the substrate,
wherein display sub-pixels and interference sub-pixels of the plurality of sub-pixel pairs are all electroluminescent elements,
wherein, the display sub-pixels are configured to be turned on in a first time period of a display cycle;
the interference sub-pixels are configured to be turned on in a second time period of the display cycle which does not overlap with the first time period, the first time period is greater than the second time period, and wherein
with regard to each of the sub-pixel pairs, a color of the interference sub-pixel and a color of the display sub-pixel are complementary colors superposed into a white color, a gray scale of the interference sub-pixel is as same as a gray scale of the display sub-pixel.

2. The display device according to claim 1, further comprising: a first control unit configured to, with regard to the sub-pixel pair, in the first time period of the display cycle, turn on the display sub-pixel and turn off the interference sub-pixel, and in the second time period of the display cycle, to turn on the interference sub-pixel and turn off the display sub-pixel.

3. The display device according to claim 1, wherein, with regard to the sub-pixel pair, a connection line of a center of the interference sub-pixel and a center of the display sub-pixel is perpendicular to the main surface of the substrate.

4. The display device according to claim 2, wherein, in the display cycle, the first time period is prior to the second time period.

5. The display device according to claim 1, wherein, with regard to the sub-pixel pair, the interference sub-pixel and the display sub-pixel are sequentially arranged on a same side of the substrate along the light outgoing direction of the display device, the interference sub-pixel includes: a first electrode layer, a first light emitting layer and a second electrode layer which are sequentially arranged along the light outgoing direction of the display device, a material of the first electrode layer is a light reflecting metal, and a material of the second electrode layer is a transparent material;
the display sub-pixel includes: a third electrode layer, a second light emitting layer and a fourth electrode layer which are sequentially arranged along the light outgoing direction of the display device, and a material of the third electrode layer and a material of the fourth electrode layer are both of transparent material.

6. The display device according to claim 1, wherein, with regard to the sub-pixel pair, the display sub-pixel and the interference sub-pixel are sequentially arranged on a same side of the substrate along the light outgoing direction of the display device, the display sub-pixel includes: a fifth electrode layer, a third light-emitting layer and a sixth electrode layer which are sequentially arranged along the light outgoing direction of the display device, a material of the fifth electrode layer is a light reflecting metal, and a material of the sixth electrode layer is a transparent material;
the interference sub-pixel includes: a seventh electrode layer, a fourth light-emitting layer and an eighth electrode layer which are sequentially arranged along the light outgoing direction of the display device, and a material of the seventh electrode layer and a material of the eighth electrode layer are both of transparent material.

7. The display device according to claim 1, wherein, each of the interference sub-pixels is a sub-pixel which is not white nor black.

8. A display system, comprising a wearable device and the display device, the display device comprising: a substrate, and a plurality of sub-pixel pairs each consisting of a display sub-pixel and an interference sub-pixel which are disposed at a same side of the substrate and overlapped with each other in a light outgoing direction intersecting with the substrate, wherein display sub-pixels and interference sub-pixels of the plurality of sub-pixel pairs are all electroluminescent elements, and with regard to each of the sub-pixel pairs, a color of the interference sub-pixel and a color of the display sub-pixel are complementary colors superposed into a white color, a gray scale of the interference sub-pixel is as same as a gray scale of the display sub-pixel, wherein, the wearable device includes a lens, and the lens is configured to be in a non-transmissive state, in a case that the interference sub-pixel emits light, the display device further includes: a first control unit configured to, with regard to the sub-pixel pair, in a first time period of a display cycle, turn on the display sub-pixel and turn off the interference sub-pixel, and in a second time period of the display cycle, to turn on the interference sub-pixel and turn off the display sub-pixel, wherein the second time period does not overlap with the first time period;

the wearable device further includes a second control unit, configured to control the lens to be transmissive in the first time period and non-transmissive in the second time period, the first time period is greater than the second time period.

9. The display system according to claim 8, wherein, the second control unit is further configured to control the lens to be transmissive in all time periods of one display cycle.

10. A control method of a display device, wherein, the display device comprises a substrate, a plurality of sub-pixel pairs each consisting of a display sub-pixel and an interference sub-pixel which are disposed at a same side of the substrate and overlapped with each other in a light outgoing direction intersecting with the substrate, wherein display sub-pixels and interference sub-pixels of the plurality of sub-pixel pairs are all electroluminescent elements, and with regard to each of the sub-pixel pairs, a color of the interference sub-pixel and a color of the display sub-pixel are complementary colors superposed into a white color, a gray scale of the interference sub-pixel is as same as a gray scale of the display sub-pixel, and the method comprises:

controlling the display sub-pixel to be turned on in a first time period of a display cycle;

controlling the interference sub-pixel to be turned on in a second time period of the display cycle which does not overlap with the first time period, wherein, the first time period is greater than the second time period.

11. The control method according to claim 10, wherein, in the display cycle, the first time period is prior to the second time period.

12. The display device according to claim 1, wherein, a ratio of the first time period to the second time period is k, and k is less than or equal to 5.

13. The display system according to claim 8, wherein, a ratio of the first time period to the second time period is k, and k is less than or equal to 5.

14. The control method according to claim 10, wherein, a ratio of the first time period to the second time period is k, and k is less than or equal to 5.

* * * * *